United States Patent [19]

Yamaguchi

[11] Patent Number: 5,001,533
[45] Date of Patent: Mar. 19, 1991

[54] BIPOLAR TRANSISTOR WITH SIDE WALL BASE CONTACTS

[75] Inventor: Toshio Yamaguchi, Tokyo, Japan

[73] Assignee: Kabushiki Kaisha Toshiba, Kawasaki, Japan

[21] Appl. No.: 438,202

[22] Filed: Nov. 20, 1989

[30] Foreign Application Priority Data

Dec. 22, 1988 [JP] Japan .................................. 63-322060
Dec. 22, 1988 [JP] Japan .................................. 63-322061

[51] Int. Cl.$^5$ ...................... H01L 29/72; H01L 27/12; H01L 27/04
[52] U.S. Cl. ........................................ 357/34; 357/33; 357/35; 357/49; 357/50
[58] Field of Search ........................ 357/34, 59, 42, 91, 357/33; 437/31, 34, 54, 162, 193

[56] References Cited

U.S. PATENT DOCUMENTS

| | | | |
|---|---|---|---|
| 4,710,241 | 12/1987 | Komatsu | 357/34 X |
| 4,782,030 | 7/1987 | Katsumata et al. | 357/34 X |
| 4,797,372 | 1/1989 | Verret et al. | 357/34 X |

FOREIGN PATENT DOCUMENTS

| | | |
|---|---|---|
| 56-1556 | 1/1981 | Japan . |
| 59-217364 | 12/1984 | Japan . |
| 61-208872 | 9/1986 | Japan . |

Primary Examiner—Rolf Hille
Assistant Examiner—Mahshid Saadat
Attorney, Agent, or Firm—Oblon, Spivak, McClelland, Maier & Neustadt

[57] ABSTRACT

A bipolar-type semiconductor device includes a semiconductor substrate on which a collector layer of a first conductivity type, a multilayered structure having a first insulating layer, a first semiconductor layer for connecting a base region, containing an impurity of a second conductivity type, and a second insulating layer, which are sequentially stacked on the semiconductor substrate, in which a first opening is formed in the first semiconductor layer and the second insulating layer, and a second opening having a smaller width than that of the first opening is formed in a position of the first insulating layer corresponding to the bottom portion of the first opening, a second semiconductor layer of the first conductivity type constituting a collector or emitter region formed in the second opening on the impurity-doped layer, a third semiconductor layer of the second conductivity type formed in the first opening, in which a first portion on the second semiconductor layer constitutes a base region, and a second portion adjacent to the first semiconductor layer constitutes a base connecting region, a third insulating layer formed on the base connecting region, and an impurity-doped region of the first conductivity type formed on a surface region of the third semiconductor layer surrounded by the third insulating layer, the impurity-doped region constituting an emitter or collector region.

6 Claims, 8 Drawing Sheets

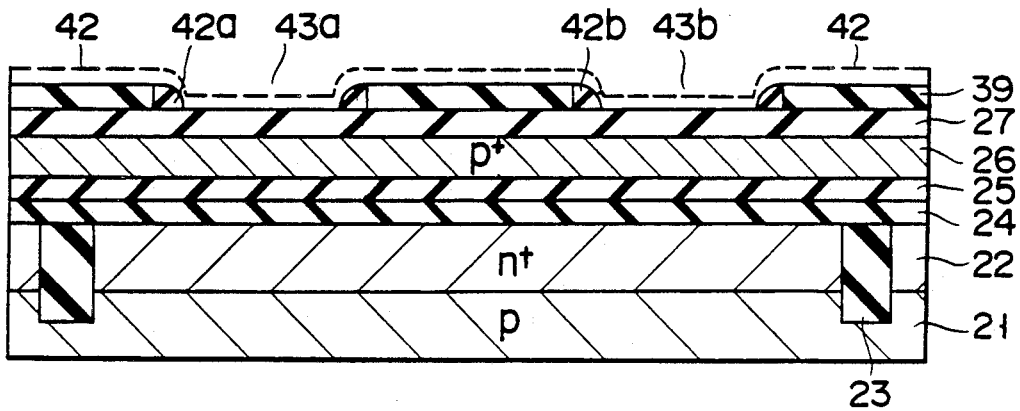
F I G. 3C
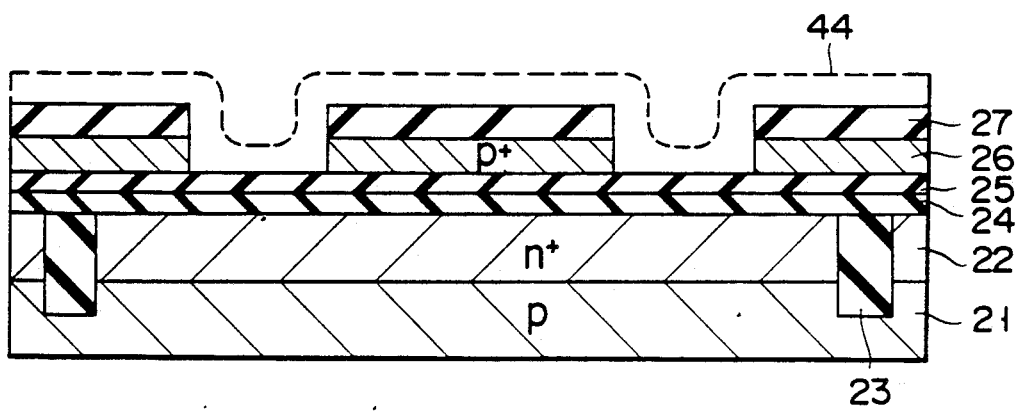
F I G. 3D
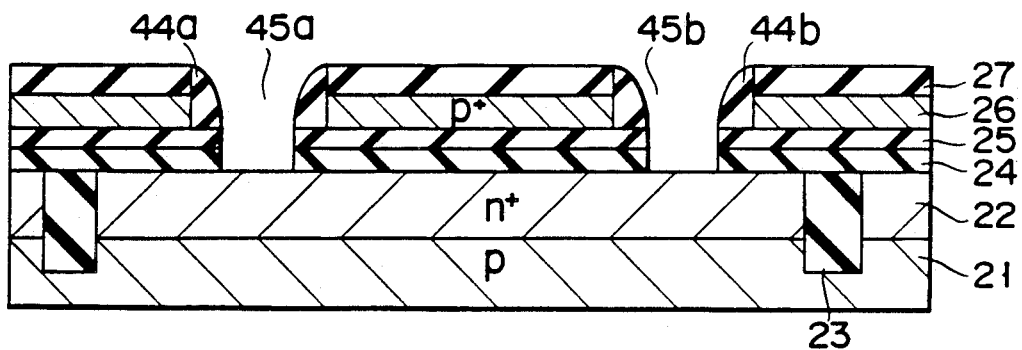
F I G. 3E

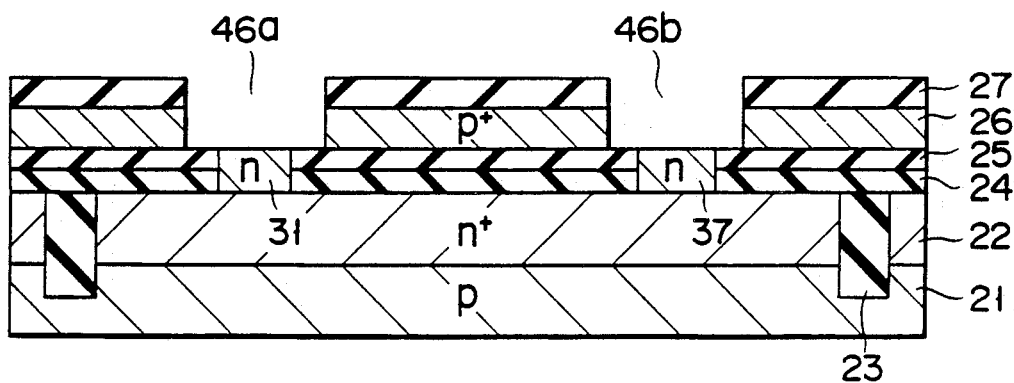
F I G. 3F
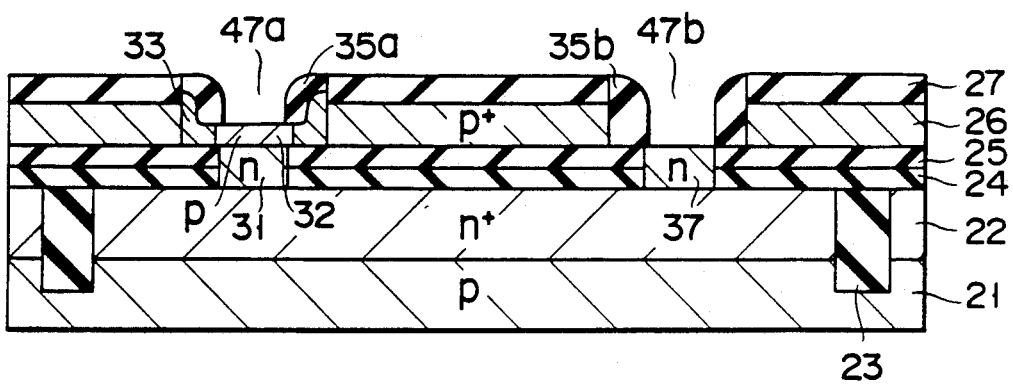
F I G. 3G
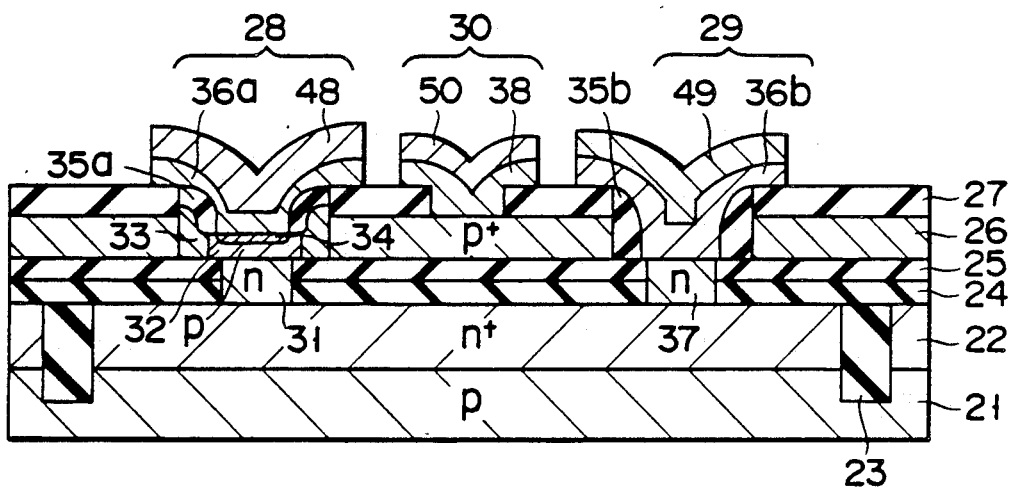
F I G. 3H

BIPOLAR TRANSISTOR WITH SIDE WALL BASE CONTACTS

BACKGROUND OF THE INVENTION

1. Field of the Invention

The present invention relates to a semiconductor device and a method of manufacturing the same and, more particularly, to a bipolar transistor which can be micropatterned and manufactured in self-alignment, and a method of manufacturing the same.

2. Description of the Related Art

High performance bipolar transistors have been demanded in various application fields such as computers and various analog circuits. Recently, in a manufacturing technique for bipolar transistors, a self alignment technique for base and emitter regions has been proposed. An example of this technique is described in Japanese Patent Disclosure No. 61-208872.

FIGS. 1A to 1D are sectional views showing the steps in manufacturing a bipolar transistor by a self alignment technique. As shown in FIG. 1A, an n+-type buried layer 2 is formed in a p-type silicon substrate 1, and an n-type silicon layer 3 is epitaxially grown on the p-type silicon substrate 1. Then, an $SiO_2$ layer 4 is selectively formed in n-type silicon layer 3 to reach the n+-type buried layer 2 and n-type silicon layer 3 by, e.g., a LOCOS process. Thereafter, a polycrystalline silicon layer 5a is formed on the entire surface by, e.g., a CVD process. After boron ions are implanted in the polycrystalline silicon layer 5a, predetermined annealing is performed to diffuse the implanted boron ions in the silicon layer 3, thus forming a p-type base region 6. Then, a polycrystalline silicon layer 5b is formed on the polycrystalline silicon layer 5a by the CVD process, thus forming a polycrystalline silicon layer 5 having an increased thickness. Thereafter, boron ions are implanted in the polycrystalline silicon layer 5 so that the layer 5 has a p-type conductivity.

As shown in FIG. 1B, after an $SiO_2$ layer 7 is formed on the polycrystalline silicon layer 5 by the CVD process, a photoresist layer 8 having a predetermined pattern is formed on the $SiO_2$ layer 7. Using the photoresist layer 8 as a mask, the $SiO_2$ layer 7 and the polycrystalline silicon layer 5 are vertically etched in sequence by reactive ion etching (RIE), to form a groove. Thereafter, the photoresist layer 8 is removed. Then, predetermined annealing is performed to activate the boron ions in the polycrystalline silicon layer 5.

As represented by a broken line in FIG. 1C, an $SiO_2$ layer 9 is formed on the entire surface by the CVD process. Then, the $SiO_2$ layer 9 is vertically and anisotropically etched by reactive ion etching to remove the $SiO_2$ layer 9 except for a portion 10 formed on a side wall of the groove.

As shown in FIG. 1D, a polycrystalline silicon layer 11 is formed on the entire surface by the CVD process. An n-type impurity such as As is heavily implanted in a portion of the base region 6, surrounded by the sidewall $SiO_2$ layer 10, through the polycrystalline silicon layer 11. Then, predetermined annealing is performed to form an emitter region 13. The emitter region 13 is formed in self-alignment with the polycrystalline silicon layer 5, serving as a base connecting electrode, and an inner base region 14. Upon this annealing, a large amount of boron ions contained in the base connecting electrode 5 are diffused in the base region 6 and the silicon layer 3. As a result, p+-type graft base region 14 is integrally formed around the inner base region 12. Thereafter, predetermined emitter, base, and collector electrodes are formed, thus forming an npn bipolar transistor.

According to the above-mentioned conventional method, in the step shown in FIG. 1D, annealing is performed in order to diffuse impurities, and p+-type graft base region 14 is formed. Therefore, the base-collector capacity is increased due to the presence of the graft base region. As a result, power consumption is increased, and it becomes difficult to achieve high-speed operation. Though the emitter region is formed in self-alignment, opening formed in polycrystalline silicon layer 5 and $SiO_2$ layer 7 in the step shown in FIG. 1B is limited by a pattern dimension in photolighography. A columnar projection consisting of n-type region 3 and p-type region 6, which are surrounded by $SiO_2$ layer 4 and formed in the step shown in FIG. 1A becomes larger in size because of mask alignment error. Thus, micro-fabricating of a bipolar transistor is restricted.

SUMMARY OF THE INVENTION

It is an object of the present invention to provide a semiconductor device which can achieve low power consumption, high-speed operation, and minute structure.

It is another object of the present invention to provide a method of manufacturing a semiconductor device which can achieve low power consumption, a high-speed operation, and minute structure.

According to the present invention, there is provided a semiconductor device comprising a semiconductor substrate on the surface of which an impurity-doped layer of a first conductivity type is formed; a multilayered structure including a first insulating layer, a base connecting first semiconductor layer containing an impurity of a second conductivity type and a second insulating layer, which are sequentially stacked on the semiconductor substrate, and in which a first opening is formed in the first semiconductor layer and the second insulating layer, and a second opening, having a smaller width than that of the first opening, is formed in a position of the first insulating layer corresponding to the bottom portion of the first opening; a second semiconductor layer of the first conductivity type formed on the impurity-doped layer in the second opening; a third semiconductor layer of the second conductivity type formed in the first opening, in which a portion on the second semiconductor layer constitutes a base region and a portion adjacent to the first semiconductor layer constitutes a base connecting region; a third insulating layer formed on the base connecting region; and an impurity-doped region of the first conductivity type formed in a surface region of the third semiconductor layer surrounded by the third insulating layer.

In the above semiconductor device, the second semiconductor layer operates as a collector region, and the impurity-doped region operates as an emitter region. Alternatively, the second semiconductor layer operates as an emitter region, and the impurity-doped region operates as a collector region.

According to the present invention, there is provided a method of manufacturing a semiconductor device comprising the steps of forming a first insulating layer, a base connecting first semiconductor layer containing an impurity of a second conductivity type, and a second insulating layer on a semiconductor substrate on which an impurity-doped layer of a first conductivity type is formed, in the order named; forming a first opening in the first semiconductor layer and the second insulating layer; forming a third insulating layer on the entire surface, anisotropically etching the third insulating layer to leave a first side-wall insulating layer, which is a part of the third insulating layer, on a side wall of the first opening; etching the first insulating layer exposed in the first opening using the side-wall insulating layer and the second insulating layer as a mask to expose the impurity-doped layer, thereby forming a second opening; forming a second semiconductor layer of the first conductivity type in the second opening; removing the side-wall insulating layer to expose a side surface of the first semiconductor layer; forming a third semiconductor layer of the second conductivity type in the first opening, in which a portion on the second semiconductor layer constitutes a base region and a portion adjacent to the first semiconductor layer constitutes a base connecting region; forming a fourth insulating layer on the entire surface, anisotropically etching the fourth insulating layer to form a second side-wall insulating layer on the base connecting region; and forming an impurity-doped region of the first conductivity type in a surface region of the third semiconductor layer surrounded by the second side-wall insulating layer.

According to the present invention, there is provided a method of manufacturing a semiconductor device comprising the steps of forming a first insulating layer, a first semiconductor layer containing an impurity of a second conductivity type, and a second insulating layer on a semiconductor substrate on which an impurity-doped layer of a first conductivity type is formed, in the order named; forming a first opening in the second insulating layer, forming a third insulating layer on the entire surface; anisotropically etching the third insulating layer to leave a first side-wall insulating layer, which is a part of the third insulating layer, on a side wall of the first opening; etching the first semiconductor layer, exposed in the first opening, and the first insulating layer, using the first side-wall insulating layer and the second insulating layer as masks to expose the impurity-doped layer, thereby forming a second opening; forming a second semiconductor layer of the second conductivity type constituting a base region in the second opening to be in connect with the first semiconductor layer; forming a fourth insulating layer on the entire surface, anisotropically etching the fourth insulating layer to leave a second side-wall insulating layer on the first side-wall insulating layer, the part of the first semiconductor layer being still exposed in the second opening; and forming an impurity-doped region of the first conductivity type in a surface region of the second semiconductor layer surrounded by the second side-wall insulating layer.

BRIEF DESCRIPTION OF THE DRAWINGS

FIGS. 3A to 3H are sectional views showing the steps in manufacturing the bipolar transistor shown in FIG. 2;

DETAILED DESCRIPTION OF THE PREFERRED EMBODIMENTS

In a semiconductor device according to the present invention, an opening is formed in a multilayered structure including a first insulating layer, a base connecting first semiconductor layer containing a impurity of a second conductivity type, and a second insulating layer, which are sequentially stacked on a semiconductor substrate. A base region is formed in the opening in self-alignment. The base region is connected to the base connecting first semiconductor layer in a lateral direction. For this reason, extension of a graft base region, formed by diffusing the impurity of the second conductivity type from the base connecting first semiconductor layer, into a collector region is prevented. As a result, an increase in base-collector junction capacity can be suppressed.

Preferred embodiments of the present invention will be described hereinafter.

Figure 1A:
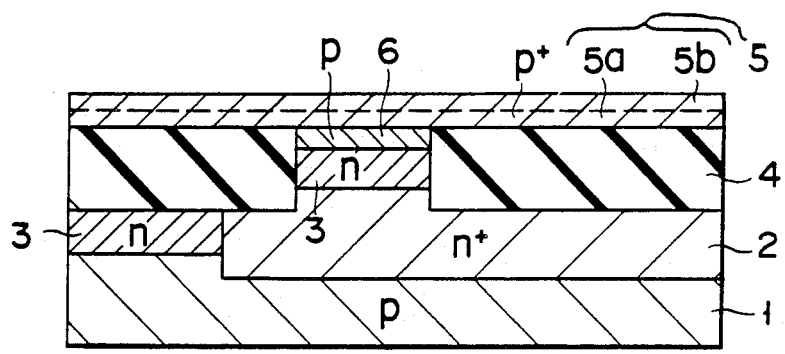
FIGS. 1A to 1D are sectional views showing the steps in manufacturing a conventional bipolar transistor.
Figure 1B:
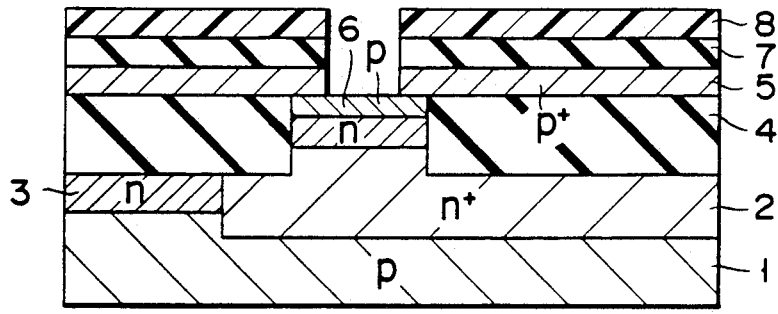
Figure 1C:
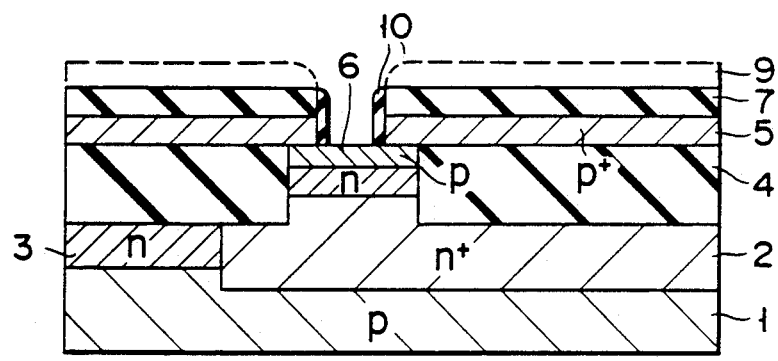
Figure 1D:
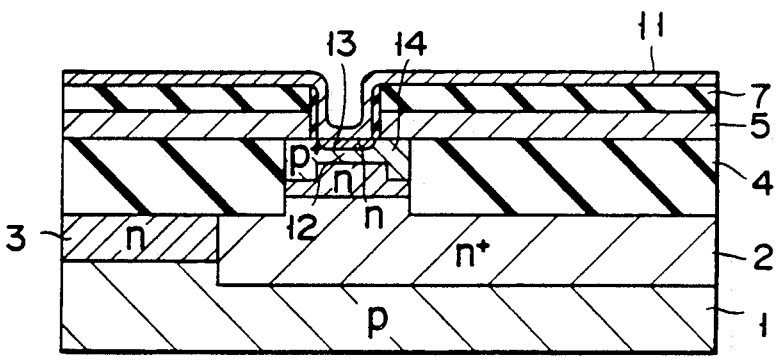
Figure 2:
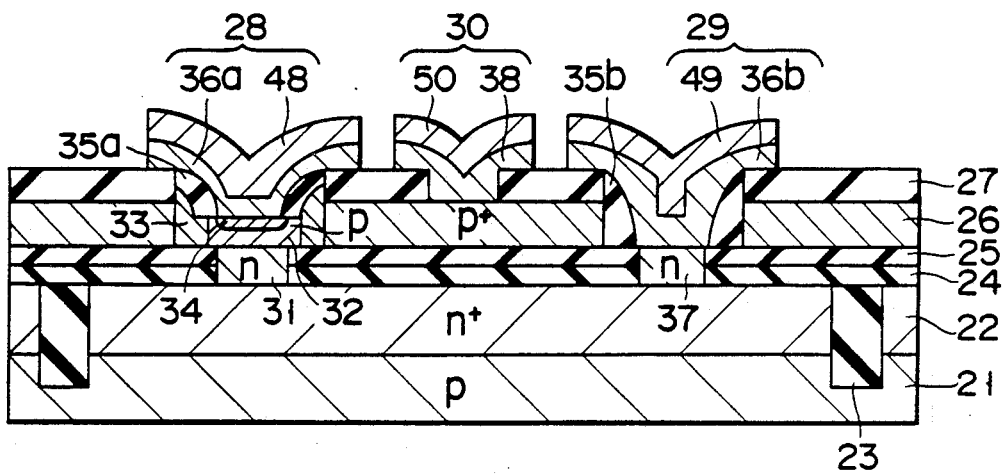
FIG. 2 is a sectional view showing a bipolar transistor according to one embodiment of the present invention.

FIG. 2 is a sectional view of a bipolar transistor according to an embodiment of the present invention.

A silicon layer 22 heavily doped with $n^+$-type impurity (concentration: $1 \times 10^{20}$ cm$^{-3}$) is formed on a p-type silicon substrate 21. A groove is formed in an element isolating portion of the bipolar transistor and an insulating layer 23 made of $SiO_2$ is buried in the groove. On the silicon layer 22 heavily doped with $n^+$-type impurity, a first insulating layer consisting of an $SiO_2$ layer 24 having a thickness of about 1,000 to 5,000 Å and a silicon nitride layer 25 having a thickness of about 1,000 Å, a polycrystalline silicon layer 26 doped with boron (boron concentration: $2.5 \times 10^{20}$ cm$^{-3}$) and having a thickness of about 3,000 Å as a first semiconductor layer, and a second insulating layer 27 consisting of $SiO_2$ and having a thickness of about 1,500 to 3,000 Å are sequentially formed. Openings are formed in the multilayered structure consisting of the first insulating layer 24, 25, the first semiconductor layer 26, and the second insulating layer 27 to form emitter, base, and collector electrodes 28, 30, and 29 at predetermined positions.

A structure of the emitter electrode 28 will be described below. More specifically, a first opening (on the left side) is formed in the $SiO_2$ layer 27 and the polycrystalline silicon layer 26. In addition, at the bottom of the first opening, a second opening smaller than the first opening is formed in the $SiO_2$ layer 24 and the silicon nitride layer 25. The second opening reaches the silicon layer 22 heavily doped with $n^+$-type impurity. A collector region 31 consisting of an n-type epitaxial silicon layer (n-type impurity concentration: $1 \times 10^{15}$ cm$^{-3}$) is formed in the second opening. A base region 32, consisting of a p-type epitaxial silicon layer, (p-type impurity concentration: $1 \times 10^{18}$ cm$^{-3}$), is formed on the collector region 31 and is connected to the polycrystalline silicon layer 26. A base connecting region 33 doped with p-type impurity is formed between the base region 32 and the polycrystalline silicon layer 26. The impurity concentration of the base connecting region 33 is lower than that of the polycrystalline silicon layer 2 and higher than that of the base region 32. Then an n-type emitter region 34 is formed on the part of the base region 32 by, e.g., ion implantation. In order to isolate the emitter region 34 from the base connecting region 33, a side wall insulating layer 35 a consisting of $SiO_2$ is formed on the base connecting region 33 to serve as a third insulating layer. A polycrystalline silicon layer 36 a in which arsenic ions are implanted is then formed on the emitter region 34, and an aluminum layer 48 is formed on a surface of the polycrystalline silicon layer 36a. The polycrystalline silicon layer 36a and the aluminum layer 48 constitute the emitter electrode 28.

The structure of the collector electrode 29 will be described below. A third opening (on the right side) is formed in the $SiO_2$ layer layer and the polycrystalline silicon layer 26 in the same manner as in the emitter electrode 28. Thereafter, at a bottom portion of the third opening, a fourth opening smaller than the third opening is formed in the $SiO_2$ layer 24 and the nitride layer 25. The fourth opening, wherein an n-type epitaxial silicon layer 37 is formed, reaches the silicon layer 22 heavily-doped with $n^+$-type impurity. The polycrystalline silicon layer 36b in which arsenic ions are implanted is formed on the n-type epitaxial silicon layer 37. In order to isolate the polycrystalline silicon layer 36b from the polycrystalline silicon layer 26, the $SiO_2$ layer 35b as a third insulating layer is formed on the side walls of the polycrystalline silicon layer 26 and the $SiO_2$ layer 27. In addition, the aluminum layer 49 is formed on the surface of the polycrystalline silicon layer 36b. The polycrystalline silicon layer 36b and the aluminum layer 49 constitute the collector electrode 29.

The structure of the base electrode 30 will be described below. A fifth opening (in the central portion) which reaches the polycrystalline silicon layer 26 is formed in the $SiO_2$ layer 27. A polycrystalline silicon layer 38, in which boron ions are implanted, is formed in the fifth opening. In addition, the aluminum layer 50 is formed on the surface of the polycrystalline silicon layer 38. the polycrystalline silicon layer 38 and the aluminum layer 50 constitute the base electrode 30.

In the bipolar transistor with the above structure, since the base connecting region 33 is formed, diffusion of the p-type impurity contained in the polycrystalline silicon layer 26 into the collector region 31 through the base region 32 of the transistor can be minimized, and an increase in base-collector junction capacity can be suppressed, thus enabling low power consumption and high-speed operation.

FIGS. 3A to 3H are sectional view showing, in order, the steps for manufacturing the bipolar transistor shown in FIG. 2.

Figure 3A:
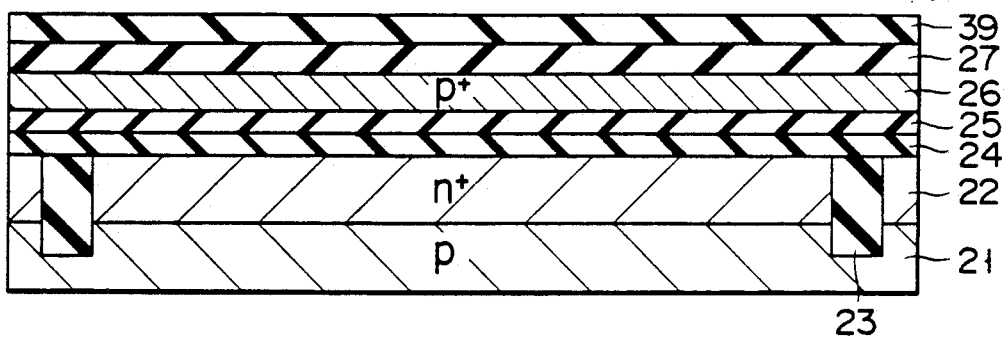

The silicon layer 22 heavily-doped with $n^+$-type impurity is formed by ion implantation of an impurity into the p-type silicon substrate 21, or by epitaxial growth method of silicon containing an impurity. Thereafter, a groove is formed in the element isolating region of the bipolar transistor, and the $SiO_2$ insulating layer 23 is buried in the groove. As will be described later, the silicon layer 22 heavily-doped with $n^+$-type impurity is connected to a collector contact. The $SiO_2$ layer 24 and the silicon nitride layer 25 as the first insulating layer, and the polycrystalline silicon layer 26 having a thickness of about 3,000 Å as the first semiconductor layer, are each sequentially deposited on the entire surface of the silicon substrate. Then, boron ions are implanted in the polycrystalline silicon layer 26 at an accelerated energy of 50 KeV and a dose of $1 \times 10^{16}$ ions/cm$^2$. In addition, the $SiO_2$ layer 27 and the silicon nitride layer 39, each having a thickness of about 1,500 to 3,000 Å as the second insulating layers, are sequentially deposited on the entire surface (FIG. 3A).

Figure 3B:
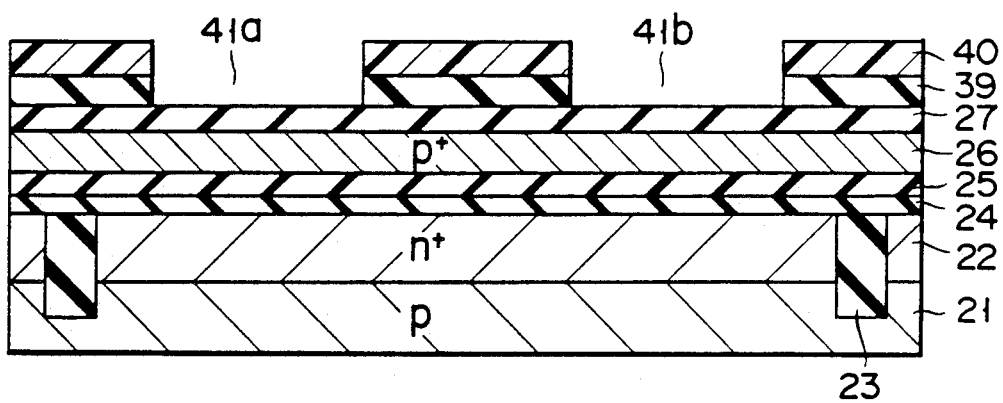

A photoresist serving as a mask material layer is applied to the entire surface and patterned by photoetching to form a mask pattern 40 for covering a portion other than the prospective base, emitter and collector regions. Anisotropic etching, e.g., RIE, is performed using the mask pattern as an etching mask to selectively remove the silicon nitride layer 39, thus exposing the $SiO_2$ layer 27 to form openings 41a and 41b (FIG. 3B).

After the mask pattern 40 is removed, a silicon nitride layer 42 is deposited in the openings 41a, 41b and on the silicon nitride layer 39 by CVD method, as represented by a broken line. Then, reactive ion etching (anisotropic etching using a gas mixture of $CHF_4$ and $H_2$) is performed, leaving silicon nitride layers 42a, 42b having a thickness of about 3,000 Å, in self-alignment on the side walls of the openings 41a, 41b thus forming openings 43a, 43b. A micropatterned bipolar transistor can be obtained by controlling the thickness of the side-wall insulating layers 42a, 42b (FIG. 3C).

The $SiO_2$ layer 27 is selectively removed by reactive ion etching (anisotropic etching using a gas mixture of $CHF_3$ and $O_2$) using the nitride layer 39 and the nitride layers 42a, 42b left on the side walls of the openings 43a, 43b as a mask. Then, the nitride layers 39 and 42a, 42b are completely removed. In addition, the polycrystalline silicon layer 26 is removed by reactive ion etching (anisotropic etching using a gas mixture of $CF_4$ and $O_2$) to expose the nitride layer 25. Then, as represented by a broken line, an $SiO_2$ layer 44 as a sixth insulating layer is deposited in the opening 43 and on the $SiO_2$ layer 27, that is, on the entire surface by CVD process (FIG. 3D).

$SiO_2$ layers 44a, 44b each having a thickness of about 1,000 Å, are left on the side walls of the openings 43 in self-alignment by reactive ion etching (anisotropic etching using a gas mixture of $CHF_3$ and $O_2$) of the entire surface to form openings 45a, 45b. The openings 45a, 45b are therefore formed in self-alignment with the openings 43a, 43b, so that a high degree of integration can be achieved. The nitride layer 25 is selectively removed by reactive ion etching (anisotropic etching using a gas mixture of $CHF_4$ and $H_2$) using the $SiO_2$ layer 27 and the $SiO_2$ layers 44a, 44b left on the side walls of the openings 45a, 45b as a mask. In addition, the $SiO_2$ layer 24 is selectively removed by reactive ion etching (anisotropic etching using a gas mixture of $CHF_3$ and $O_2$), using the $SiO_2$ layer 27 and the $SiO_2$ layers 44a, 44b as a mask to expose the silicon layer 22 heavily doped with $n^+$-type impurity (FIG. 3E). At this time, the thicknesses of the $SiO_2$ layers 44a and 44b and the $SiO_2$ layer 27 are reduce.

An n-type epitaxial silicon layer is grown on the surface of the exposed layer 22 by using selective epitaxial growth so as to reach, e.g., the same level as the surface of the nitride layer 25, thus forming the collector region 31 and collector contact region 37. Then, the $SiO_2$ layer 44a, 44b left on the side walls of the openings 45a, 45b are removed to form openings 46a, 46b (FIG. 3F).

A p-type silicon layer having a thickness of about 1,000 Å is grown on the surfaces of the collector region 31 and the side walls of the polycrystalline silicon layer 26 and the $SiO_2$ layer 27, consisting of the n-type epitaxial silicon layer, by selective epitaxial growth method in an atmosphere containing $B_2H_6$, $H_2$, $SiH_2Cl_2$ and HCl at a temperature of 900° C. at a pressure of 50 Torr. to form the silicon layer 32 as the base region and the silicon layer 33 as the base connecting region. The p-type silicon layer has a substantially flat surface, and that portion of the silicon layer, which is adjacent to the polycrystalline silicon layer 26, rises along the side walls of the polycrystalline silicon layer 26 and the SiO$_2$ layer 27. At this time, the silicon layer 32 as the base region on the collector region 31 becomes single-crystalline silicon, and the silicon layer 33 as the base connecting region adjacent to the exposed polycrystalline silicon layer 26 becomes a polycrystalline silicon. This base connecting region 33 serves to connect the base region consisting of a p-type epitaxial silicon layer 32 to the polycrystalline silicon layer 26. A p-type impurity is diffused into the base connecting region 33 from the polycrystalline silicon layer 26, and thus the impurity concentration of the base connecting region 33 becomes higher than that of the base region 32. Then, the p-type silicon layer grown on the collector contact portion 37 is removed. In order to isolate an emitter region 34 to be formed later from the base connecting region 33, an SiO$_2$ layer 45 is deposited by CVD method on the entire surface of the structure, that is, in the openings 46 and on the SiO$_2$ layer 27. Thereafter, the SiO$_2$ layers 35$a$, 35$b$ having a thickness of about 500 Å, are left in self-alignment on the side walls of the openings 46$a$, 46$b$ by reactive ion etching (anisotropic etching using a gas mixture of CHF$_3$ and O$_2$) of the entire surface, thus forming an opening 47$a$, 47$b$. Then, arsenic ions are implanted in a prospective emitter formation region of the opening 47$a$ at an accelerated energy of 35 KeV and a dose of $1 \times 10^{14}$ ions/cm$^2$ to form the n-type emitter region 34 (FIG. 3G).

After a polycrystalline silicon layer, having a thickness of about 1,500 Å, is deposited on the entire surface, portions corresponding to the emitter, collector, and base electrodes are isolated from each other by photoetching and reactive ion etching (anisotropic etching using a gas mixture of CF$_4$ and O$_2$) so as to have larger widths than those of the electrodes to be formed later by a predetermined amount. Thereafter, arsenic ions are implanted in the polycrystalline silicon layer corresponding to the lead-out layer for the emitter and collector regions 34, 37 at an accelerated energy of 35 KeV and a dose of $1.2 \times 10^{16}$ ions/cm$^2$. Boron ions are implanted in the polycrystalline silicon layer 38 corresponding to the lead-out layer for the base region 32 at an accelerated energy of 50 KeV and a dose of $1 \times 10^{16}$ ions/cm$^2$. In addition, desired annealing is performed to activate the impurity atoms. Thereafter, an aluminum layer as an interconnecting material is deposited on the entire surface, and the aluminum layer and the polycrystalline silicon layers are patterned to have a predetermined width by photoetching and reactive ion etching (anisotropic etching using a gas mixture of Cl$_2$ and H$_2$), thus forming aluminum pattern 48, 49 and 50 and polycrystalline silicon patterns 36$a$, 36$b$ and 38. As a result, the emitter, collector, and base electrodes 28, 29 and 30 are formed, thus forming the bipolar transistor (FIG. 3H).

Thus, an opening in the SiO$_2$ layer 24 and the nitride layer 25 is formed in self-alignment at the bottom of the opening formed in the polycrystalline silicon layer 26 and the SiO$_2$ layer 27, and the transistor is formed in the opening. Therefore, only one mask alignment operation is required to form the main transistor body. For this reason, a micropatterned transistor can be formed.

Where an n-type impurity is diffused in the prospective emitter formation region to form the emitter region 34, it can be diffused from the polycrystalline silicon layer 36 instead of direct implantation of an impurity. After the step in FIG. 3G, the n-type emitter region can be formed by using the method of selective epitaxial growth.

Although the SiO$_2$ layer or the nitride layer is used as an insulating layer, various other materials can be used.

In addition, due to the characteristic of the bipolar transistor, the usages of the collector and the emitter regions in the above embodiment can be reversed.

FIGS. 4A to 4F are sectional views showing the steps in manufacturing a bipolar transistor according to another embodiment of the present invention.

A layer 22 heavily doped with n$^+$-type impurity is formed on a p-type silicon substrate 51 by ion-implantation of an impurity into the p-type silicon substrate 51, or by epitaxial growth method of silicon containing an impurity. Thereafter, a groove is formed in an element isolating partion of a bipolar transistor, and an insulating layer 53 is buried in this groove. As will be described later, the layer 52 heavily doped with n$^+$-type impurity is connected to a collector contact layer.

Figure 4A:
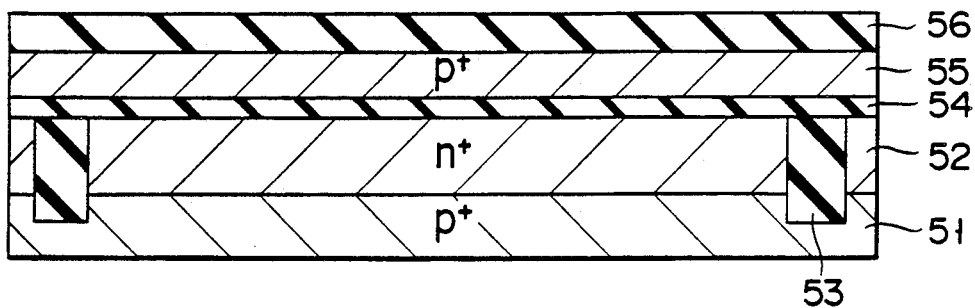
FIGS. 4A to 4F are sectional views showing the steps in manufacturing a bipolar transistor according to another embodiment of the present invention.

A first SiO$_2$ layer 54 (first insulating layer), having a thickness of about 1,000 to 5,000 Å, is formed on the entire surface of the silicon substrate by thermal oxidation. Then, a polycrystalline silicon layer 55, having a thickness of about 3,000 Å, is deposited on the entire surface of the layer 54 as a first semiconductor layer. Then, boron ions are implanted in the polycrystalline silicon layer 55 at an accelerated energy of 50 KeV and a dose of $1 \times 10^{16}$ ions/cm$^2$. In addition, a second SiO$_2$ layer 56 (second insulating layer), having a thickness of about 1,500 to 3,000 Å, is deposited on the entire surface (FIG. 4A).

Figure 4B:
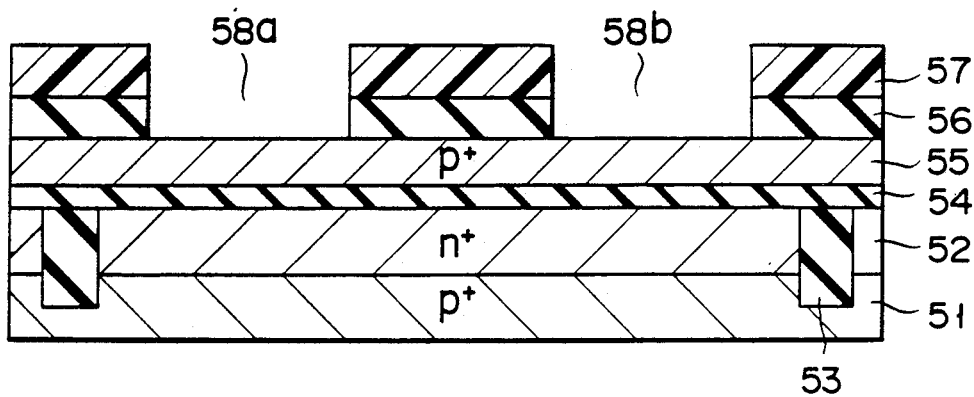

A photoresist is applied to the entire surface as a mask material layer, and is patterned by photoetching to form a mask pattern 57 which covers the portion except prospective base, emitter and collector regions. The second SiO$_2$ layer 56 is selectively removed by reactive ion etching (RIE) using the mask pattern 57 as an etching mask to partially expose the polycrystalline silicon layer 55, thus forming first openings 58$a$, 58$b$ (FIG. 4B).

Figure 4C:
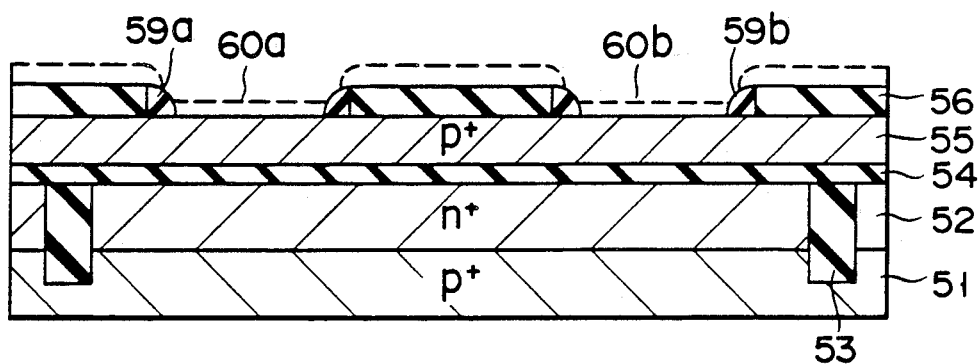

After the mask pattern 57 is removed, a third SiO$_2$ layer 59 (third insulating layer) is deposited on the entire surface, that is, in the first openings 58$a$, 58$b$ and on the second SiO$_2$ layer 56, as represented by a broken line. Then, the third SiO$_2$ layers 59$a$ and 59$b$, having a thickness of about 3,000 Å, are left on the side walls of the first openings 58 in self-alignment, by reactive ion etching (anisotropic etching using a gas mixture of CHF$_3$ and O$_2$) to form second openings 60$a$, 60$b$. By adjusting the thicknesses of the side walls, it is possible to manufacture a miniaturized bipolar transistor (FIG. 4C).

Figure 4D:
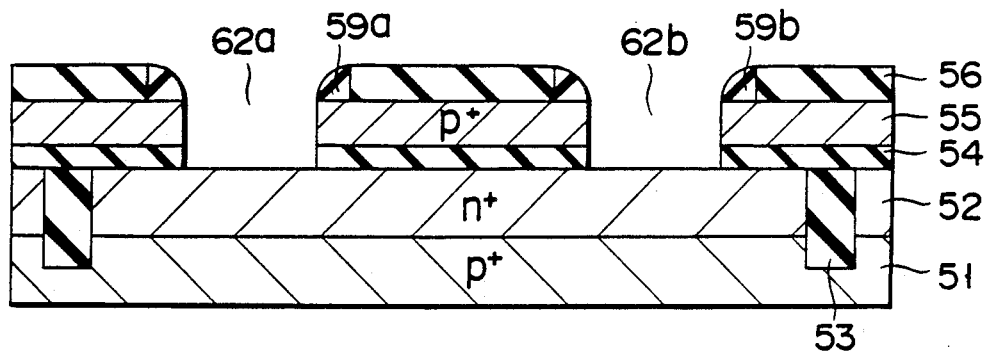

The polycrystalline silicon layer 55 is removed by reactive ion etching (anisotropic etching using a gas mixture of CF$_4$ and O$_2$) using the second SiO$_2$ layer 56 and the third SiO$_2$ layer 59$a$, 59$b$ left on the side walls of the second openings 60$a$, 60$b$ as a mask. In addition, the first SiO$_2$ layer 54 is similarly removed by reactive ion etching (anisotropic etching using a gas mixture of CHF$_3$ and O$_2$), to expose the layer 52 heavily doped with n$^+$-type impurity, thus forming third openings 62$a$, 62$b$ (FIG. 4D).

An n-type epitaxial silicon layer 61 (second semiconductor layer), operating as a collector region, is grown on a surface of the exposed layer 52 by selective epitaxial growth method, to such a thickness as to electrically connect it to the polycrystalline silicon layer 55. Boron ions are implanted in the second opening 62a, which is the prospective base formation region, at an accelerated energy of 20 KeV and a dose of $5.0 \times 10^{13}$ ions/cm$^2$, so that a p-type impurity profile does not reach the layer 52 heavily doped with n$^+$-type impurity. Thus, a p-type base region 63 is formed, adjacent to the polycrystalline silicon layer 55 for connecting the base region 63.

Figure 4E:
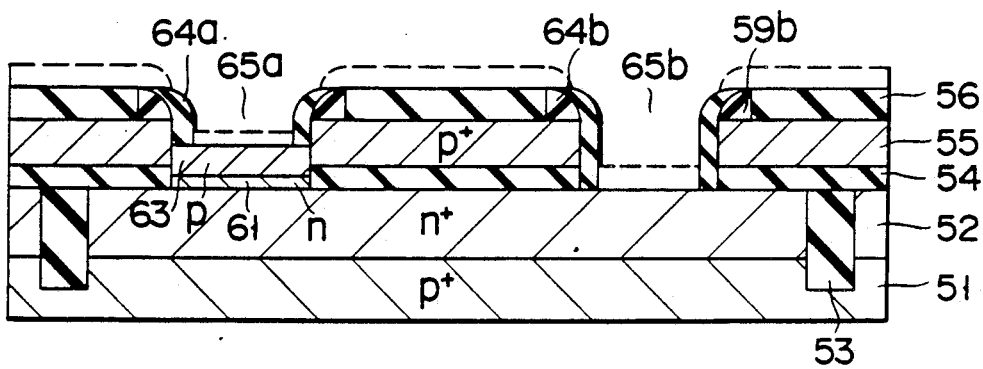

Thereafter, the n-type epitaxial silicon layer grown on an opening 62b for the collector contact is removed by photoetching and reactive ion etching (anisotropic etching using a gas mixture of CF$_4$ and O$_2$) to expose the layer 52 heavily doped with n$^+$-type impurity. Then, in order to prevent exposure of the polycrystalline silicon layer 55 in the prospective collector contact region, and to isolate the emitter electrode from the polycrystalline silicon layer 55, a fourth SiO$_2$ layer 64 (fourth insulating layer) is deposited by CVD method on the entire surface, that is, in the third openings 62a, 62b and on the second insulating layer 56. Then, the fourth SiO$_2$ layer 64, having a thickness of about 500 Å, is left in self-alignment on the side wall of the second opening 60 by reactive ion etching (anisotropic etching using a gas mixture of CHF$_3$ and O$_2$) of the entire surface. Thus, a fourth opening 65a, 65b are formed (FIG. 4E).

Figure 4F:
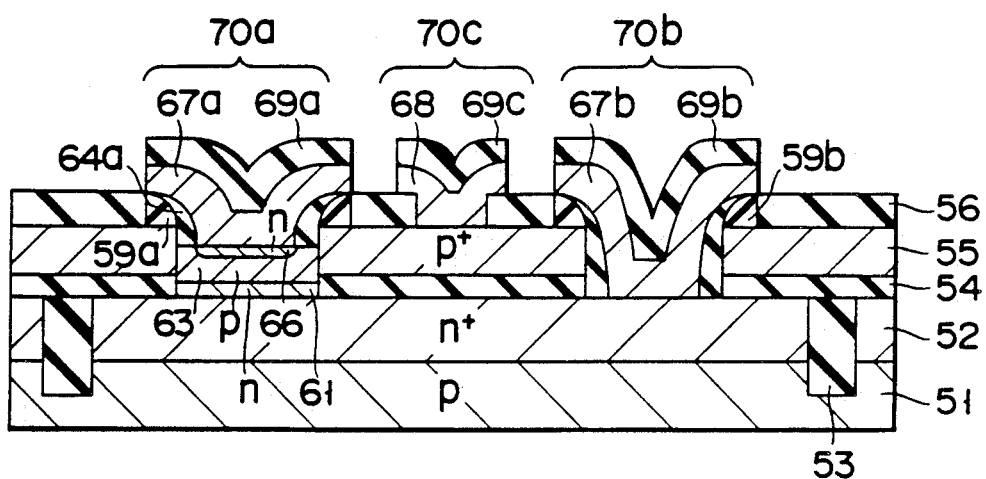

Arsenic ions are implanted in the prospective emitter region in the fourth opening 65a, at an accelerated energy of 35 KeV and a dose of $1 \times 10^{14}$ ions/cm$^2$, to form an n-type emitter region 66. In addition, an opening is formed at a predetermined position on the second insulating layer 56 by reactive ion etching (anisotropic etching using a gas mixture of CHF$_3$ and O$_2$) to form a base electrode. Then, a polycrystalline silicon layer, having a thickness of about 1,500 Å, is deposited on the entire surface. Thereafter, portions corresponding to the emitter, collector, and base electrodes are isolated from each other by photoetching and reactive ion etching (anisotropic etching using a gas mixture of CF$_4$ and O$_2$) so as to have larger widths than those of the electrodes by a predetermined amount. Thereafter, arsenic ions are implanted in a polycrystalline silicon layer 67, serving as an connecting layer for the emitter and collector regions, at an accelerated energy of 35 KeV and a dose of $1 \times 10^{16}$ ions/cm$^2$. Boron ions are implanted in a base lead-out polycrystalline silicon layer 68 at an accelerated energy of 50 KeV and a dose of $1.2 \times 10^{16}$ ions/cm$^2$. In addition, desired annealing is performed to activate the impurity atoms. In this case, a base-collector junction is located under the first SiO$_2$ layer 54, so that formation of a graft base region can be prevented. Thereafter, an aluminum layer is deposited on the entire surface as an electrode wiring material, and the aluminum layer and the polycrystalline silicon layers are patterned by photoetching and reactive etching (anisotropic etching using a gas mixture of Cl$_2$ and H$_2$) to form the emitter electrode 70 a consisting of polycrystalline silicon pattern 67a and aluminum pattern 69a, collector, electrode 70b consisting of polycrystalline silicon pattern 67b and aluminum pattern 69b, and base electrode 70c consisting of polycrystalline silicon pattern 68 and aluminum pattern 69c, respectively having predetermined widths, thus forming a bipolar transistor (FIG. 4F).

Where an n-type impurity is diffused in the prospective emitter formation region to form the emitter region, it can be diffused from the polycrystalline silicon layer 67a to form the emitter region instead of direct implantation of an impurity in the prospective emitter formation region as in the above embodiment shown in FIGS. 4A to 4F.

Figure 5:
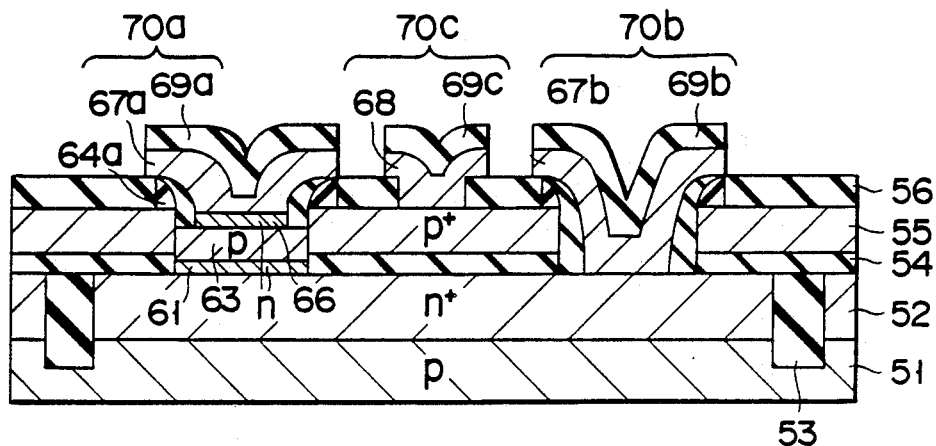
FIG. 5 is a sectional view showing a modification of the bipolar transistor shown in FIG. 4F.

When the emitter region 66 is formed, an n-type epitaxial silicon layer can be formed immediately on the p-type impurity epitaxial layer 63 exposed in the third opening 65a, by using selective epitaxial growth method after the side wall is formed by the fourth SiO$_2$ layer 64 (FIG. 5).

When the base region is formed, after the layer 52 heavily doped with n$^+$-type impurity, formed immediately under the prospective base and emitter formation regions is exposed, an n-type epitaxial silicon layer and a p-type epitaxial silicon layer can be sequentially stacked by selective epitaxial growth method, and the former layer can serve as a collector region and the latter layer can serve as a base region.

Figure 6A:
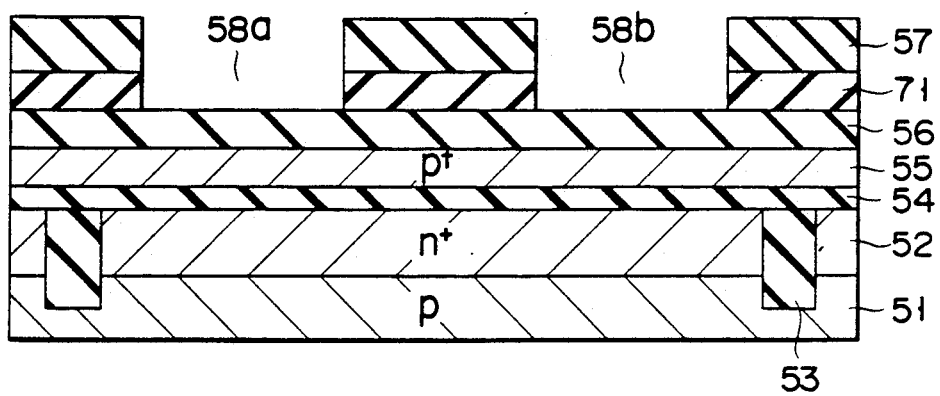
FIGS. 6A to 6C are sectional views showing a modification of the steps in manufacturing the bipolar transistor shown in FIGS. 4A to 4C.
Figure 6B:
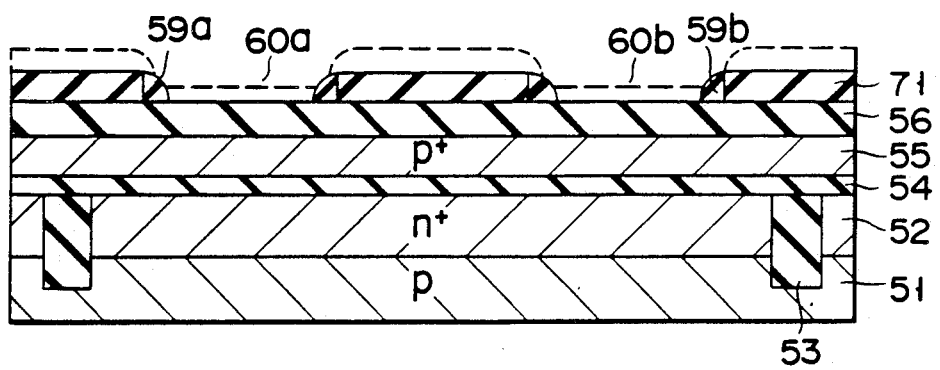
Figure 6C:
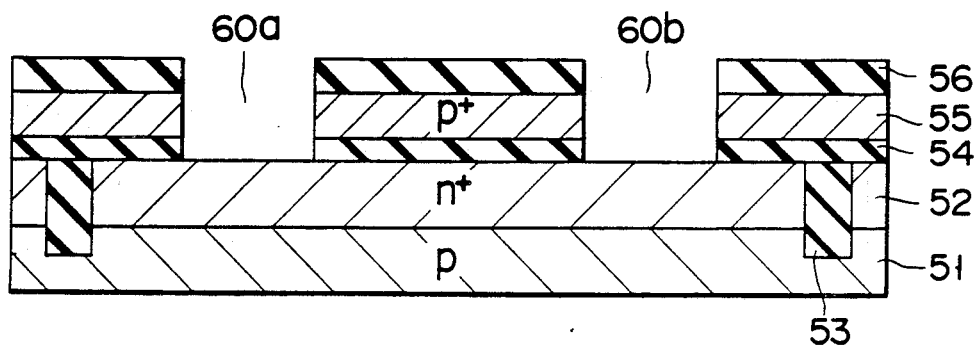

The second openings can be formed by an upper layer. More specifically, as shown in FIG. 6A, when the second openings are formed, a fifth insulating layer, e.g., an SiO$_2$ layer 70, having a thickness of about 1,500 to 3,000 Å, is deposited on the second insulating layer 56. Thereafter, as shown in the step in FIG. 6B, the fifth SiO$_2$ layer 70 is removed by photoetching and etching using the mask material layer 57, thereby exposing the second SiO$_2$ layer 56 to form the first openings 58a, 58b (FIG. 6A). Then, after the mask material layer 57 is removed, as represented by a broken line, the third insulating layer, e.g., the SiO$_2$ layer, is deposited on the first openings 58a, 58b and the fifth SiO$_2$ layer 71. Then, the third SiO$_2$ layer 59a, 59b is left on the side walls of the first openings 58a, 58b in self-alignment, by using reactive ion etching to form the second openings 60a, 60b (FIG. 6B). Thereafter, the second SiO$_2$ layer 56 is removed by reactive ion etching (anisotropic etching), using the third SiO$_2$ layer 59a, 59b left on the side walls of the second openings 60a, 60b as a mask, and the polycrystalline silicon layer 55 and the first SiO$_2$ layer 54 are removed, as shown in the step in FIG. 4D. In addition, the fifth SiO$_2$ layer 71 and the third insulating layer 59a, 59b left on the side walls of the second openings 60a, 60b are removed by etching, so that each second opening 60a, 60b an upper portion of which is not curved (as shown in FIG. 4D) but has right angles, can be obtained (FIG. 6C).

Figure 7:
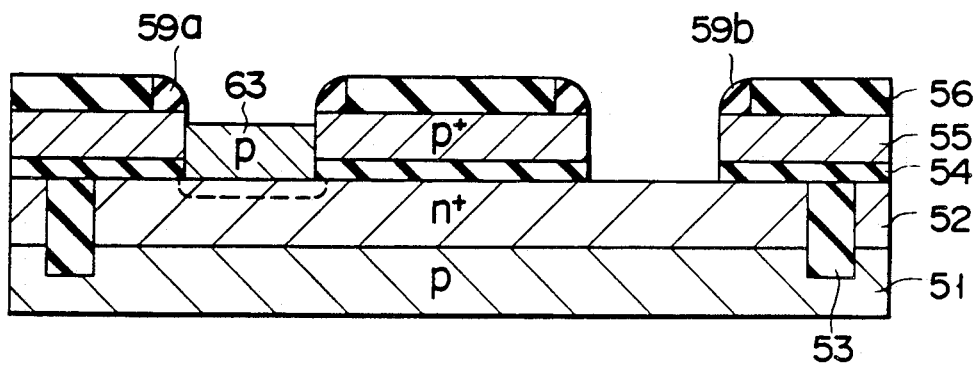
FIG. 7 is a sectional view showing another modification of the bipolar transistor shown in FIG. 4F.

When the base region is formed, after the epitaxial layer 52 heavily doped with n$^+$-type impurity formed immediately under the prospective base formation region is exposed, the p-type epitaxial silicon layer 63 can be directly grown by selective epitaxial growth method to serve as a base region. In this case, a portion of the layer 52 heavily doped with n$^+$-type impurity, which is in contact with the p-type epitaxial silicon layer 63, serves as a collector region. As represented by a broken line, the p-type impurity atoms in the epitaxial silicon layer 63 can be slightly diffused in the layer 52 heavily doped with n$^+$-type impurity by annealing (FIG. 7).

Although the SiO$_2$ layers are used as the first to fifth insulating layers, various other materials can be selected and used. In this embodiment, in the structure of the bipolar transistor, the usage of the collector and emitter regions can be reversed.

According to the above-mentioned embodiment shown in FIGS. 4A to 7, a columnar region of the transistor is formed by using one photomask. At this time, since the columnar region is defined by a pattern having a width decreased by a side-wall self-aligned layer, a micropatterned transistor can be realized. In addition, when the base electrode lead-out polycrystalline silicon layer is connected to the base region, a planar joint with the columnar region is not required. Therefore, formation of an excessively large graft base region can be prevented, thus suppressing an increase in base-collector junction capacity.

What is claimed is:

1. A semiconductor device comprising:
   a semiconductor substrate on which an impurity-doped layer of a first conductivity type is formed;
   a multilayered structure including a first insulating layer, a first semiconductor layer for connecting a base region, containing an impurity of a second conductivity type, and a second insulating layer, which are sequentially stacked on said semiconductor substrate, in which a first opening is formed in said first semiconductor layer and said second insulating layer, and a second opening having a smaller width than that of said first opening is formed in a position of said first insulating layer corresponding to the bottom portion of said first opening;
   a second semiconductor layer of the first conductivity type formed in said second opening on said impurity-doped layer;
   a third semiconductor layer of the second conductivity type formed in said first opening, in which a first portion on said second semiconductor layer constitutes a base region and a second portion adjacent to said first semiconductor layer constitutes a base connecting region;
   a third insulating layer formed on said base connecting region; and
   an impurity-doped region of the first conductivity type formed in a surface region of said third semiconductor layer, which is surrounded by said third insulating layer.

2. A device according to claim 1, wherein said second semiconductor layer is a collector region, and said impurity-doped region is an emitter region.

3. A device according to claim 1, wherein said second semiconductor layer is an emitter region, and said impurity-doped region is a collector region.

4. A device according to claim 1, wherein said first semiconductor layer consists of polycrystalline silicon.

5. A device according to claim 1, wherein said base connecting region consists of polycrystalline silicon.

6. A device according to claim 1, wherein said first insulating layer consists of a multilayered structure including a silicon oxide layer and a silicon nitride layer.

* * * * *